(12) United States Patent
Sun et al.

(10) Patent No.: US 9,265,183 B2
(45) Date of Patent: Feb. 16, 2016

(54) MOUNTING SYSTEM FOR HARD DISK DRIVE

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Da-Long Sun, Wuhan (CN); Yu-Gui Chen, Wuhan (CN); Chung Chai, New Taipei (TW)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/524,745

(22) Filed: Oct. 27, 2014

(65) Prior Publication Data

US 2015/0230368 A1 Aug. 13, 2015

(30) Foreign Application Priority Data

Feb. 11, 2014 (CN) .......................... 2014 1 0047390

(51) Int. Cl.
*H05K 9/00* (2006.01)
*G06F 1/18* (2006.01)
*H05K 5/02* (2006.01)

(52) U.S. Cl.
CPC .............. *H05K 9/0007* (2013.01); *G06F 1/187* (2013.01); *H05K 5/0247* (2013.01)

(58) Field of Classification Search
CPC . H05K 7/1488; H05K 9/0007; H05K 5/0247; G06F 1/187
USPC ............. 361/679.02, 679.31, 679.33–679.39, 361/724–726; 174/32, 351, 377, 378
See application file for complete search history.

(56) References Cited

U.S. PATENT DOCUMENTS

| 7,137,767 | B2 * | 11/2006 | Franke et al. ................. 411/401 |
| 8,248,778 | B2 * | 8/2012 | Dai .......................... 361/679.37 |
| 8,289,693 | B2 * | 10/2012 | Li ............................. 361/679.34 |
| 2002/0051338 | A1 * | 5/2002 | Jiang et al. ..................... 361/685 |
| 2003/0198012 | A1 * | 10/2003 | Lin et al. ....................... 361/685 |
| 2007/0035920 | A1 * | 2/2007 | Peng et al. .................... 361/685 |
| 2012/0104222 | A1 * | 5/2012 | Ding ............................. 248/634 |

* cited by examiner

*Primary Examiner* — Hoa C Nguyen
*Assistant Examiner* — Amol Patel
(74) *Attorney, Agent, or Firm* — Novak Druce Connolly Bove + Quigg LLP

(57) ABSTRACT

A mounting system for a hard disk drive includes a case, an insulation member, and a mounting member. The case is configured to receive the hard disk drive and includes a sidewall and an EMI protection structure extending from the sidewall. The insulation member is secured to the sidewall. The mounting member extends through the sidewall and the insulation member and is configured to secure the hard disk drive to the case. The insulation member insulates the mounting member from the case, and the EMI protection structure is electronically coupled to the mounting member, causing the case to be electronically coupled to the hard disk drive.

14 Claims, 3 Drawing Sheets

MOUNTING SYSTEM FOR HARD DISK DRIVE

FIELD

The subject matter herein generally relates to a mounting system for a hard disk drive and an electronic device with the mounting system.

BACKGROUND

An electronic device with a hard disk drive generally includes a mounting system for the hard disk drive. The mounting system generally includes a case configured for receiving the hard disk drive, an Electromagnetic Interference (EMI) protection structure, and a securing assembly securing the EMI protection structure to the case.

BRIEF DESCRIPTION OF THE DRAWINGS

Implementations of the present technology will now be described, by way of example only, with reference to the attached figures.

DETAILED DESCRIPTION

Figure 1:
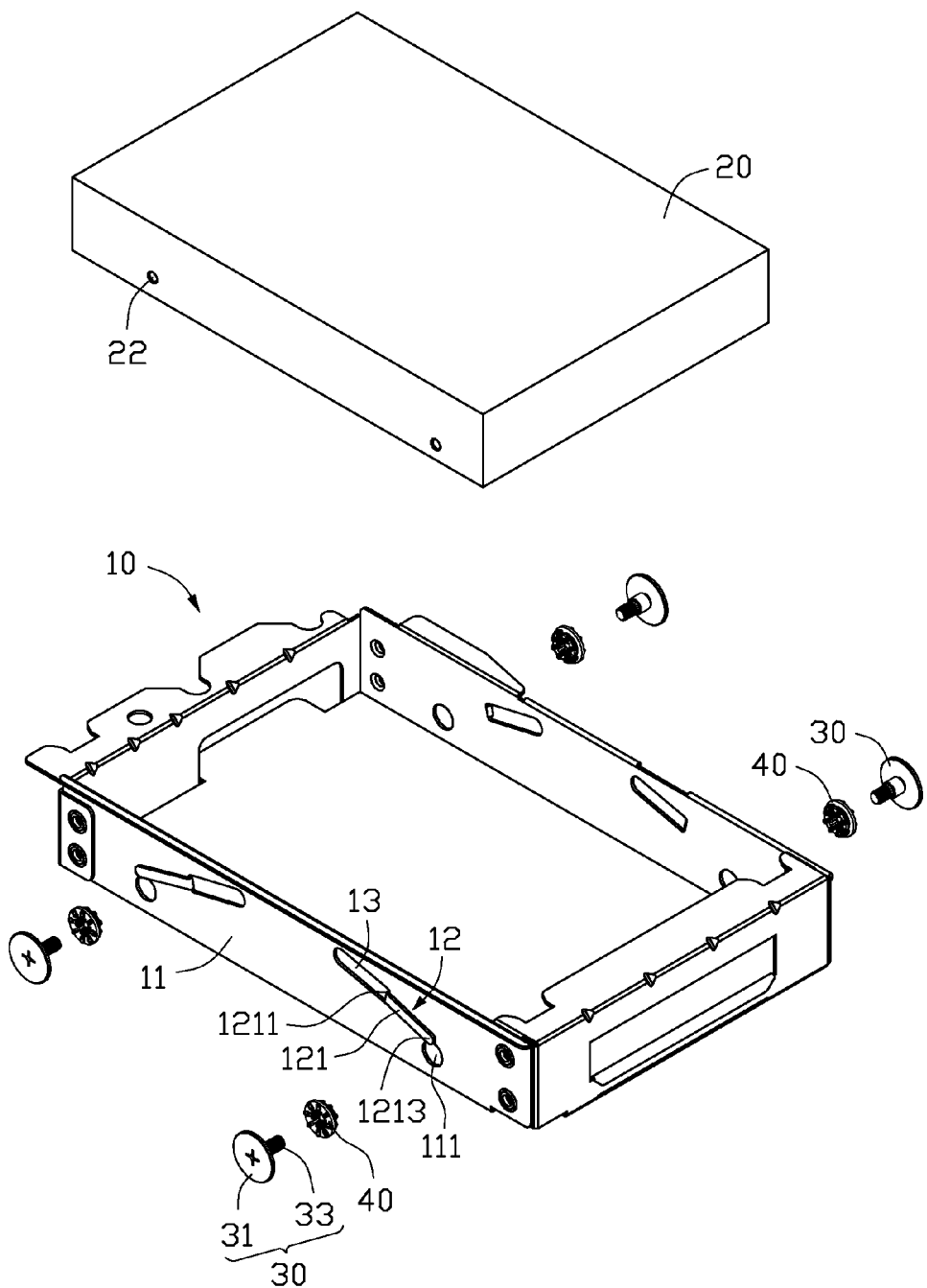
FIG. 1 is an exploded, isometric view of an embodiment of an electronic device with a mounting system and a hard disk drive.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

FIG. 1 illustrates an electronic device with a mounting system and a hard disk drive in accordance with an embodiment. The mounting system includes a case 10 configured for receiving a hard disk drive 20, a plurality of mounting members 30, and a plurality of insulation members 40. Each side of the hard disk drive 20 defines two installation holes 22.

The case 10 includes two sidewalls 11 and two EMI protection structures 12 extending from each sidewall 11. Each sidewall 11 defines two mounting holes 111 for securing the insulation members 40. Each EMI protection structure 12 includes a resilient piece 121 extending outwards from the sidewall 11. The resilient piece 121 includes a coupling end 1211 coupled to the sidewall 11 and a distal end 1213 extending from the coupling end 1211 towards the mounting hole 111. The distal end 1213 can be contact to the mounting member 30. In at least one embodiment, the resilient piece 121 is substantially parallel to the sidewall 11. The resilient piece 121 is punched from a portion of the sidewall 11, causing a stripe slot 13 to be defined on the position the portion of the sidewall 11 located. A shape of the stripe slot 13 is substantially the same as a shape of the resilient piece 121. An end of the stripe slot 13 and an end of the resilient piece 121 are two opposite edges of the coupling end 1211.

Each mounting member 30 includes a head portion 31 and a pole portion 33. A diameter of the head portion 31 is greater than a diameter of the pole portion 33. In at least one embodiment, each mounting member 30 is a screw.

Figure 2:
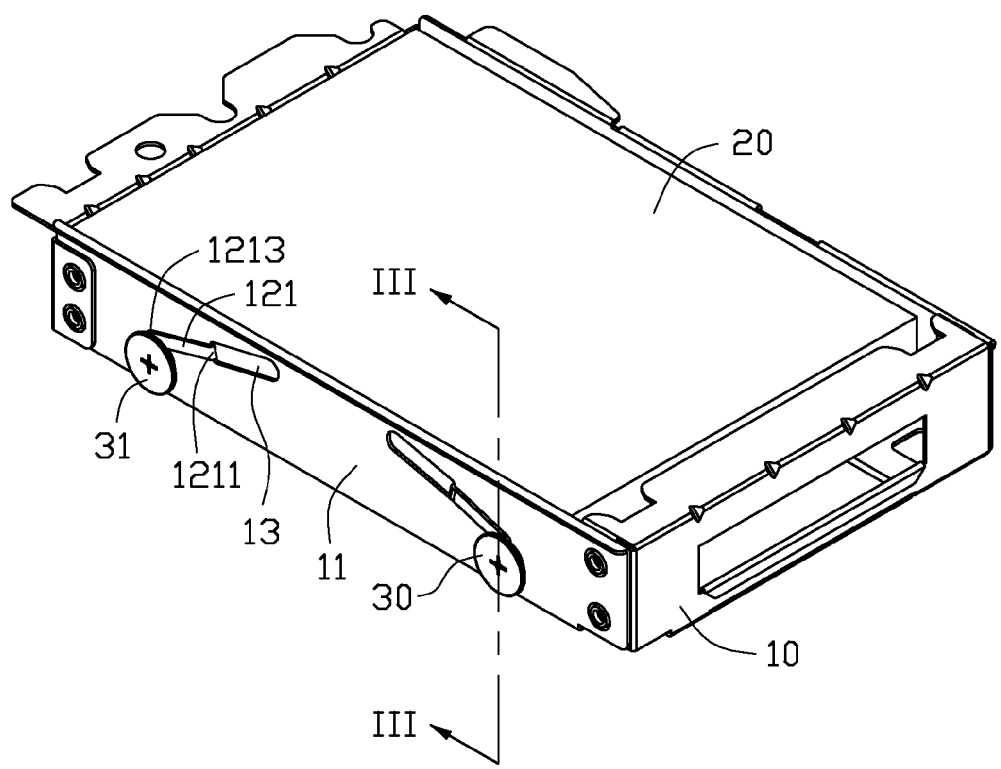
FIG. 2 is an assembled, isometric view of the mounting system and the hard disk drive of FIG. 1.
Figure 3:
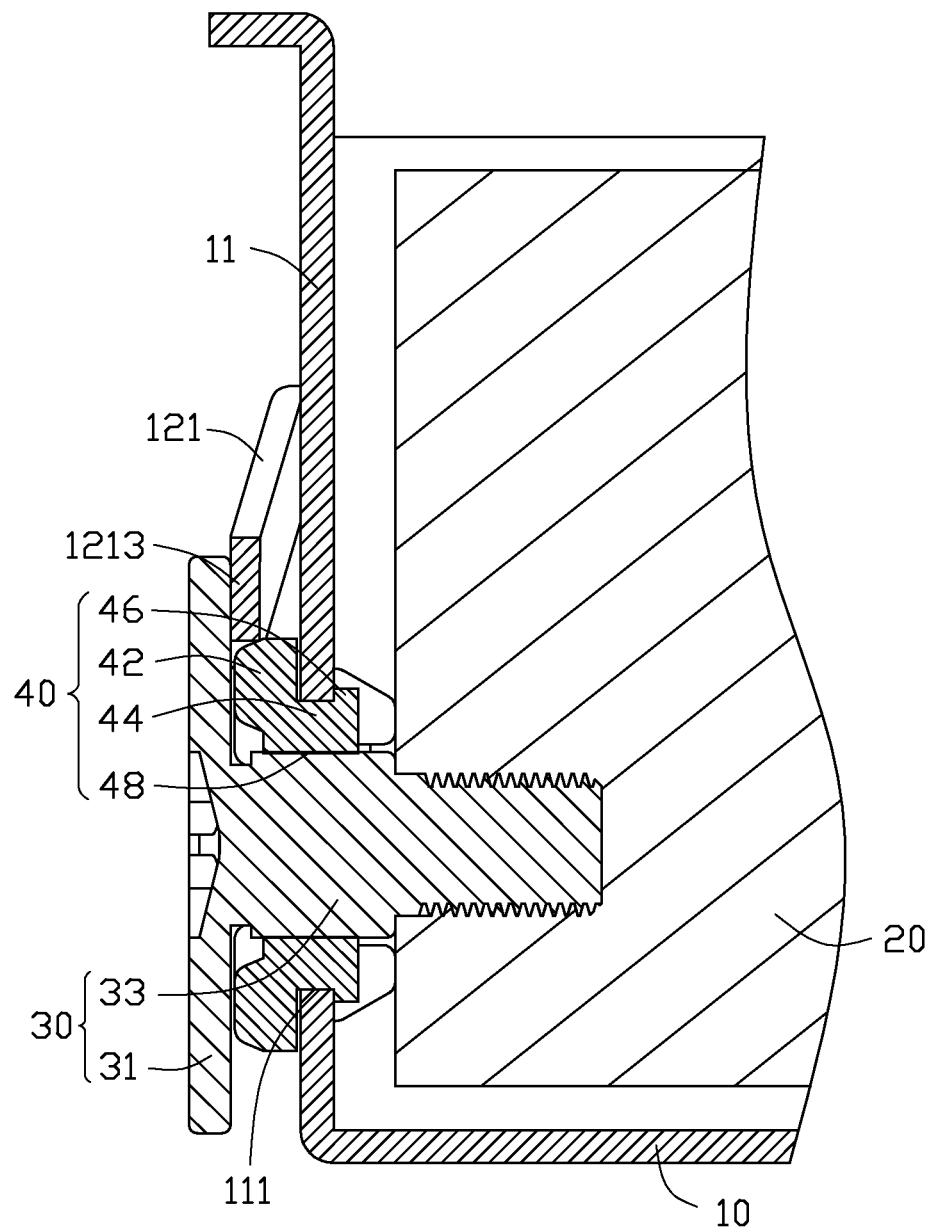
FIG. 3 is a cross sectional view of the mounting system and the hard disk drive of FIG. 2, taken along a line III-III.

FIGS. 2 and 3 illustrate that each insulation member 40 includes a first portion 42, a second portion 46, and a coupling portion 44 located between the first portion 42 and the second portion 46. Each insulation member 40 defines a through hole 48. In at least one embodiment, a cross section of the insulation member 40 is "H" shaped, and each insulation member 40 made of an insulating material.

FIGS. 2 and 3 also illustrate that in assembly, each insulation member 40 is secured to the sidewall 11. The coupling portion 44 is received in the mounting hole 111, the first portion 42 is outside of the case 10, and the second portion 46 is located inside of the case 10. The pole portion 33 is threaded into the installation hole 22 through the through hole 48, to secure the hard disk drive 20 to the case 10. The first portion 42 is sandwiched between the head portion 31 and the sidewall 11, preventing the hard disk drive 20 from shacking in the case 10. The mounting member 30 touches the EMI protection structure 12 to electronically couple the hard disk drive 20 to the case 10. In at least one embodiment, the head portion 31 resists the resilient piece 121.

The embodiments shown and described above are only examples. Many details are often found in the art such as the other features of a mounting system for hard disk drive. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:
1. A mounting system for a hard disk drive comprising:
a case configured to receive the hard disk drive and comprising a sidewall and an electro-magnetic interference (EMI) protection structure extending from the sidewall;
an insulation member secured to the sidewall; and a mounting member extending through the sidewall and the insulation member and configured to secure the hard disk drive to the case;

wherein the insulation member insulates the mounting member from the case, and the EMI protection structure is electronically coupled to the mounting member, causing the case to be electronically coupled to the hard disk drive; and wherein the mounting member comprises a head portion and a pole portion with a diameter smaller than that of the head portion, the pole portion extends through the sidewall and the insulation member and configured to be secured to the hard disk drive, the EMI protection structure comprises a resilient piece extending outwards by a portion of the sidewall, the resilient piece comprises a coupling end extending from the sidewall and a distal end extending from the coupling end, the head portion resists the distal end of the resilient piece.

2. The mounting system of claim 1, wherein the resilient piece is substantially parallel to the sidewall.

3. The mounting system of claim 1, wherein the case defines a mounting hole, and the insulation member is engaged in the mounting hole; the distal end of the resilient piece extends towards the mounting hole.

4. The mounting system of claim 3, wherein the insulation member comprises a first portion, a second portion, and a coupling portion connected between the first portion and the second portion, the first portion is located outside of the case, the second portion is located inside of the case, and the coupling portion is received in the mounting hole.

5. The mounting system of claim 4, wherein the first portion is sandwiched between the sidewall and the head portion, and the insulation member is made of an insulation material.

6. The mounting system of claim 1, wherein the resilient piece is punched from the portion of the sidewall.

7. A mounting system for a hard disk drive comprising:
a case configured to receive the hard disk drive and comprising a sidewall and an EMI protection structure extending from the sidewall;
a mounting member comprising a head portion and a pole portion extending through the sidewall and configured to secure the hard disk drive to the case; and
an insulation member secured to the sidewall and surrounding the pole portion to insulate the mounting member from the case;
wherein the EMI protection structure is electronically coupled to the head portion, causing the case to be electronically coupled to the hard disk drive, the EMI protection structure comprises a resilient piece extending outwards by a portion of the sidewall, the resilient piece comprises a coupling end extending from the sidewall and a distal end extending from the coupling end, the head portion resists the distal end of the resilient piece.

8. The mounting system of claim 7, wherein a diameter of the head portion is greater than a diameter of the pole portion, and the pole portion extends through the sidewall via a through hole defined by the insulation member.

9. The mounting system of claim 7, wherein the resilient piece is substantially parallel to the sidewall.

10. The mounting system of claim 7, wherein the resilient piece is punched from the portion of the sidewall.

11. The mounting system of claim 7, wherein the case defines a mounting hole, and the insulation member is engaged in the mounting hole; the distal end of the resilient piece extends towards the mounting hole.

12. The mounting system of claim 11, wherein the insulation member comprises a first portion, a second portion, and a coupling portion connected between the first portion and the second portion, the first portion is located outside of the case, the second portion is located inside of the case, and the coupling portion is received in the mounting hole.

13. The mounting system of claim 12, wherein the first portion is sandwiched between the sidewall and the head portion, and the insulation member is made of an insulation material.

14. A mounting system for a hard disk drive comprising:
a case configured to receive the hard disk drive, the case comprising:
a first sidewall having an inner first sidewall side and an outer first sidewall side, opposite the inner first sidewall side; and
a second sidewall opposite, and substantially parallel, to the first sidewall, the second sidewall having an inner second sidewall side facing the inner first sidewall side, and an outer second sidewall side opposite the inner second sidewall side;
one or more insulation members; and
one or more mounting members;
wherein, there is at least one mounting hole defined in, and at least one EMI protection structure extending from, at least one of the outer first sidewall side and the outer second sidewall side;
wherein, one of the one or more insulation members in positionable within the at least one mounting hole and one of the one or more mounting members is positionable to extend through the insulation member to engage with and mount the hard disk drive; and
wherein, when the hard disk drive is mounted, the insulation member positioned within the mounting hole insulates the mounting member from the at least one of the first sidewall and the second sidewall and the EMI protection structure is electronically coupled to the mounting member electronically coupling the at least one first sidewall and second sidewall to the hard disk drive, the EMI protection structure comprises a resilient piece punched from a portion of the sidewall and extending outwards; the resilient piece comprises a coupling end extending from the sidewall and a distal end extending from the coupling end towards the mounting hole; and the distal end resists the mounting member.

* * * * *